(12) United States Patent
Fabinski et al.

(10) Patent No.: US 8,728,713 B2
(45) Date of Patent: *May 20, 2014

(54) STITCHING METHODS USING MULTIPLE MICROLITHOGRAPHIC EXPOSE TOOLS

(75) Inventors: Robert P. Fabinski, Rochester, NY (US); Eric J. Meisenzahl, Ontario, NY (US); James E. Doran, Ontario, NY (US)

(73) Assignee: Truesense Imaging, Inc., Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/196,197

(22) Filed: Aug. 2, 2011

(65) Prior Publication Data

US 2012/0082938 A1      Apr. 5, 2012

Related U.S. Application Data

(60) Provisional application No. 61/388,009, filed on Sep. 30, 2010, provisional application No. 61/388,011, filed on Sep. 30, 2010, provisional application No. 61/388,020, filed on Sep. 30, 2010.

(51) Int. Cl.
*G03F 7/22*      (2006.01)

(52) U.S. Cl.
USPC .............................. 430/312; 430/22; 430/394

(58) Field of Classification Search
CPC ............ G03F 7/70475; G03F 7/70466; G03F 7/70208
USPC ........................... 430/394, 312, 22
See application file for complete search history.

(56) References Cited

U.S. PATENT DOCUMENTS

| | | |
|---|---|---|
| 5,539,224 A | 7/1996 | Ema |
| 5,663,017 A | 9/1997 | Schinella et al. |
| 5,922,495 A | 7/1999 | Kim |
| 6,030,752 A | 2/2000 | Fulford, Jr. et al. |
| 6,225,013 B1 | 5/2001 | Cohen et al. |
| 6,362,491 B1 * | 3/2002 | Wang et al. .................. 250/548 |
| 6,605,488 B1 | 8/2003 | Andersson |
| 7,389,243 B2 | 6/2008 | Gross |
| 7,651,825 B2 | 1/2010 | Van Bilsen |
| 7,687,210 B2 | 3/2010 | Leidy et al. |
| 2008/0032203 A1 | 2/2008 | Phillipps et al. |
| 2009/0225331 A1 * | 9/2009 | Van Haren .................... 356/614 |
| 2012/0082937 A1 * | 4/2012 | Fabinski et al. ............... 430/312 |

FOREIGN PATENT DOCUMENTS

| | | |
|---|---|---|
| EP | 0328410 A2 | 8/1989 |
| EP | 0959501 A2 | 11/1999 |
| JP | 60/200525 | 10/1985 |

OTHER PUBLICATIONS

International Search Report and Written Opinion mailed Dec. 20, 2011 for International Application No. PCT/US2011/053224 (11 pages).

Okigawa et al., "Reduction of Plasma-Radiation-Induced Interface States for Plasma Processes of Charge-Coupled-Device Image Sensors Using Pulse-Time-Modulated Plasma", *IEEE*, 2003, pp. 154-157.

Ishikawa et al., "Drastically Reduced Dark Current by Pulse-Time-Modulated Plasma for Precise Micro Lens Fabrication in Highly Sensitive CCD Image Sensor", *IEEE*, 2003, pp. 16.3.1-16.3.4.

* cited by examiner

*Primary Examiner* — Daborah Chacko Davis

(74) *Attorney, Agent, or Firm* — Howard & Howard Attorneys PLLC

(57) ABSTRACT

A method for producing a measurement structure for measuring alignment of patterns formed in one or more layers of patternable material uses multiple exposure tools having different resolution limits and maximum expose field sizes. The measurement structure includes multiple complementary and coincident parts. An abutting field pattern is exposed and stitched in a layer of patternable material using a first exposure tool and a first mask. The abutting field pattern includes a first portion of the multiple complementary parts. A periphery pattern is exposed in the same layer or in a different layer of patternable material using a second exposure tool and a second mask. The periphery pattern includes a second portion of the multiple complementary parts. A maximum expose field of the first exposure tool is smaller than the maximum expose field of the second exposure tool.

11 Claims, 10 Drawing Sheets

STITCHING METHODS USING MULTIPLE MICROLITHOGRAPHIC EXPOSE TOOLS

CROSS-REFERENCE TO RELATED APPLICATIONS

This application claims the benefit of U.S. Provisional Application No. 61/388,009, U.S. Provisional Application No. 61/388,011, and U.S. Provisional Application No. 61/388,020, all filed on Sep. 30, 2010. This application is related to U.S. patent application Ser. No. 13/196,163, entitled "STITCHING METHODS USING MULTIPLE MICROLITHOGRAPHIC EXPOSE TOOLS", filed concurrently herewith.

TECHNICAL FIELD

The present invention relates generally to the manufacture of semiconductor devices such as image sensors, and more particularly to an expose system and methods for producing patterns in patternable materials using stitching techniques.

BACKGROUND

The process of manufacturing semiconductor devices, such as image sensors, typically involves using microlithography to transfer patterns from a set of masks to photosensitive material on a substrate by means of an expose tool. After the photosensitive material is developed, the resulting pattern in the photosensitive material is used as a temporary removable mask for other semiconductor processes. Examples of semiconductor processes include, but are not limited to, etching and implanting. The resulting patterns in the photosensitive material can also be included in a final product. A color filter array or microlens array are examples of some resulting patterns that can be included in an image sensor.

One method for defining patterns in a photosensitive material is known as a step and repeat method. A mechanical surface known as a stage supports a substrate and is configured to accurately move the wafer over given distances. A stepper system is used when circuitry to be fabricated in the substrate is larger than the maximum expose field of the expose tool in the stepper system. The stepper system projects an image onto only a portion of the wafer. Multiple exposures of the pattern are stepped and repeated over the entire wafer. Various exposures could then be "stitched" together to form the required pattern. The terms "stitched" or "stitching" refer to the accurate positioning, or abutting, of one exposure to adjacent exposures.

Prior art stitching approaches typically require a great many expose steps at each patterning level, thereby increasing the amount of time needed to perform the exposure operation. Reducing the number of patterning levels increases the stepper capacity required to efficiently produce semiconductor devices. Moreover, with imaging devices such as image sensors, defects or disruptions in the resulting patterns of the photosensitive material can appear as artifacts in the captured images. In addition to process induced random defects, the disruptions can be caused by seams created as a result of stitching blocks of patterns. Every level of patterning potentially contributes to the production of seam artifacts.

SUMMARY

In one aspect, a method for producing a measurement structure for measuring alignment of patterns formed in a layer of patternable material disposed over a substrate uses multiple exposure tools having different resolution limits and maximum expose field sizes. The measurement structure includes multiple complementary and coincident parts. An abutting field pattern is exposed in the layer of patternable material using a first exposure tool and a first mask. The abutting field pattern is stitched in the patternable material and includes a first portion of the multiple complementary parts. A periphery pattern is exposed in the layer of patternable material around the stitched abutting field pattern using a second exposure tool and a second mask. The periphery pattern includes a second portion of the multiple complementary parts that is coincident with the first portion of the multiple complementary parts. A maximum expose field of the first exposure tool is smaller than the maximum expose field of the second exposure tool so that the combination of the stitched abutting field pattern and the periphery pattern forms a coincident measurement structure in the layer of patternable material.

In another aspect, a method for producing a measurement structure in multiple layers of patternable material disposed over a substrate uses multiple exposure tools having different resolution limits and maximum expose field sizes. The measurement structure includes coincident multiple complementary parts. A first layer of patternable material is formed over the substrate. An abutting field pattern is exposed in the first layer of patternable material using a first exposure tool and a first mask. The abutting field pattern is stitched in the first layer of patternable material and includes a portion of the multiple complementary parts. An alignment of the stitched abutting field pattern is measured and if the alignment is within tolerance, a second layer of patternable material is formed over the first layer of patternable material. A periphery pattern is exposed in the second layer of patternable, material using a second exposure tool and a second mask. The periphery pattern includes a coincident portion of the multiple complementary parts and a maximum expose field of the first exposure tool is smaller than a size of the device and the maximum expose field of the second exposure tool is at least as large as the size of the device so that the combination of the abutting field pattern and the periphery pattern forms one complete pattern in the multiple layers of patternable material. An alignment of the periphery pattern to the stitched abutting field pattern is then measured using the coincident complementary measurement structures.

BRIEF DESCRIPTION OF THE DRAWINGS

The invention will become more apparent by reference to the following detailed description of the invention taken in conjunction with the accompanying drawings. The elements of the drawings are not necessarily to scale relative to each other. Referring to the drawings, like numbers indicate like parts throughout the views.

DETAILED DESCRIPTION

Throughout the specification and claims the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

The terms "wafer" and "substrate" are to be understood as any material including, but not limited to, silicon, silicon-on-insulator (SOI) technology, silicon-on-sapphire (SOS) technology, doped and undoped semiconductors, epitaxial layers formed on a semiconductor substrate, and other semiconductor structures.

One practice for determining the proper placement, or alignment, of a new pattern in a patternable material, such as a photosensitive material, with respect to existing patterns on the substrate is to measure the alignment of structures in the region of the perimeter of some or all devices on a wafer, and inferring from that data the alignment of the new pattern with respect to the existing pattern. These structures are typically known as "Box-in-Box" (BnB). There are many variants on the BnB format, for example "Frame-in-Frame," but one aspect is always common: part of the structure is defined in the pattern being aligned to, typically an existing pattern on the substrate, and a complementary part of the structure is defined by the pattern being aligned, "the new pattern."

Figure 1:
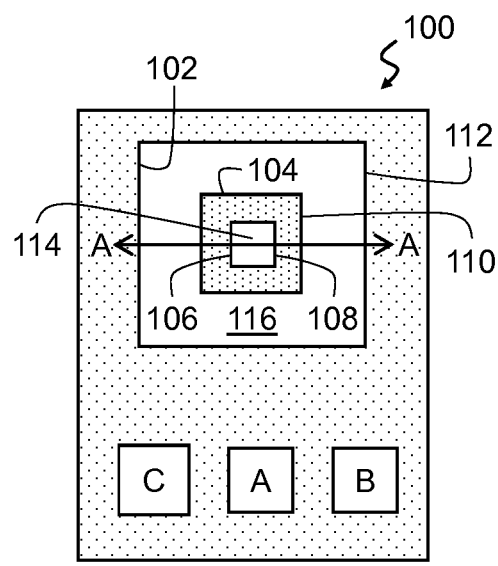
FIG. 1 illustrates a typical composite BnB measurement structure as will be defined in a patternable material on a semiconductor wafer after a dual resist layer processing.

The measurement of BnB can be done by a variety of means. One common method includes forming an optical image of the entire BnB structure, determining the distances between the peaks of the intensity profile corresponding to edges of the different parts of the structure, and computing the relative position of the complementary parts of the structure. FIG. 1 illustrates a typical composite BnB measurement structure 100 as will be defined in patternable material on the wafer after a dual layer processing. The patternable material includes, but is not limited to, a photosensitive material. The embodiments described herein are described with reference to a photosensitive material, but other embodiments can use different patternable materials.

Figure 2:
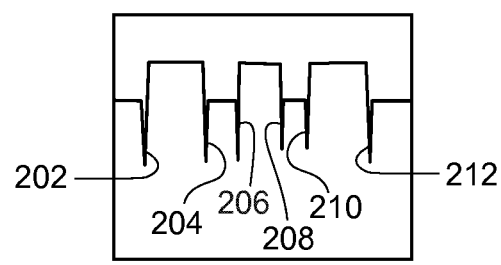
FIG. 2 is an associated intensity profile with the measurement of the region along line A-A in FIG. 1.

With a positive photosensitive material, the shaded regions represent areas where the photosensitive material will remain on the wafer after processing. FIG. 2 is an associated intensity profile with the measurement of the region along line A-A in FIG. 1. Similar analysis is done in the perpendicular direction (i.e., y-axis) to determine the alignment along that direction (not shown). The peaks in FIG. 2 represent the edges of the different parts of the structure identified in FIG. 1 as 102, 104, 106, 108, 110 and 112. Peak 202 corresponds to edge 102, peak 204 to edge 104, peak 206 to edge 106, peak 208 to edge 108, peak 210 to edge 110, and peak 212 to edge 112. The differences of the distances between the peaks in one pair of peaks (e.g., peaks 204 and 206) and between the peaks in another pair of peaks (e.g., peaks 208 and 210) indicate the relative displacement of the patterns (114 and 116) in the composite BnB structure 100 of FIG. 1.

These BnB structures are repeated at various places around the device and across the substrate in an embodiment in accordance with the invention. Calculations made from the measurement of these structures are used to disposition the alignment of the new pattern. The calculations are also used to determine offsets for the exposure tools to optimize the alignment for the next devices to be processed. The parameters typically used to make corrections to the stepper include, but are not limited to, translation, chip magnification, chip rotation, wafer stage magnification (X and Y), and wafer stage rotation (X and Y).

Figure 3A:
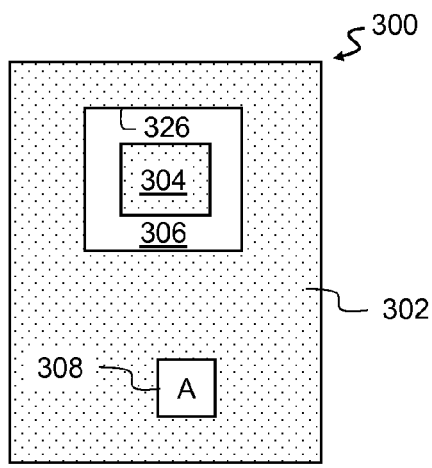
FIGS. 3A-3C illustrate how coincident complementary portions of the composite BnB shown in FIG. 1 are masked to allow the structures to be placed in the periphery of a stitched field.
Figure 3B:
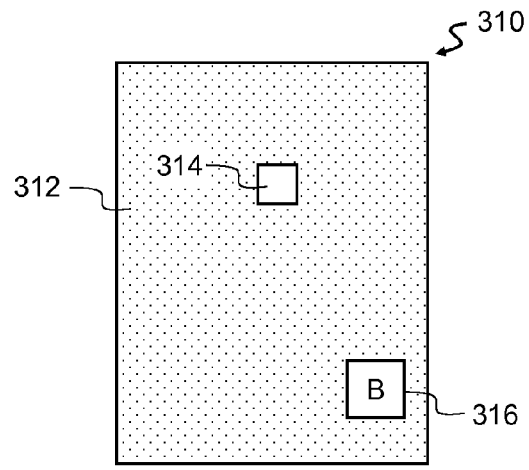
Figure 3C:
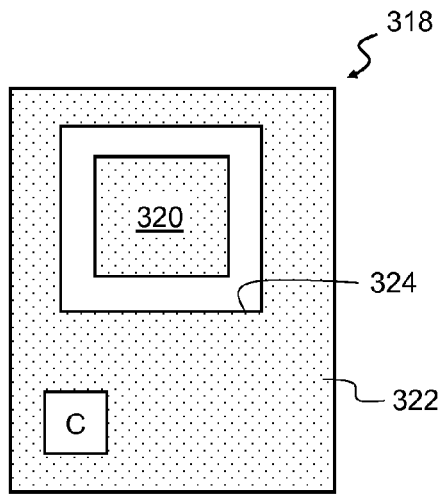

In the case of stitching, an "abutting field" version of BnB is used, where the coincident complementary parts of the structure are defined in the same layer of photosensitive material, allowing the measurement of the relative placement of separately exposed patterns defined in the same layer of photosensitive material. FIGS. 3A-3C illustrate how coincident complementary parts of the composite BnB structure shown in FIG. 1 are masked to allow the structures to be placed in the periphery of a stitched field. The coincident complementary parts are superimposed to form the composite BnB measurement structure shown in FIG. 1. FIG. 3A represents one portion 300 of the measurement structure 100 as defined on a mask. The shaded regions 302, 304 represent the opaque mask area and the non-shaded region 306 represents an area where light can transmit through and impinge upon the underlying photosensitive material. Region 308 is a label identifying the mask. Region 308 can be used to determine which edge of the completed BnB 100 is defined by this component.

FIG. 3B depicts a complementary part 310 of the composite BnB measurement structure 100 as defined on the same mask or on another mask. The complementary part 310 can be used for the first layer of photosensitive material in a dual layer process. Again, the shaded region 312 represents the opaque mask area and the non-shaded region 314 represents an area where light can propagate through and expose the underlying photosensitive material. Region 316 is a label that can be used to identify which edge of the composite BnB measurement structure 100 is defined by this component.

FIG. 3C illustrates an additional complementary part 318 of the BnB measurement structure 100 as defined on a periphery mask. A periphery pattern is a pattern of components that is formed around stitched unit cells in an embodiment in accordance with the invention. The shaded regions 320, 322 represent the opaque area on the mask. The opaque area 320 is larger than the analogous opaque area 304 in FIG. 3A, and the outer edge of the BnB structure 324 overlaps the analogous edge 326 in FIG. 3A. If the BnB represented by FIG. 3C is not used, the edge labeled 102 in FIG. 1 is the same as the edge labeled 326 in FIG. 3A. If the BnB represented by FIG. 3C is used as described in the current embodiment, the edge labeled 102 in FIG. 1 is the defined by the edge labeled 324 in FIG. 3C.

The use of BnB structures in the prior art is dedicated to either an abutting field type measurement or a standard BnB that includes a pattern defined on the substrate prior to the lithography of the level being aligned. As the complexity of patterning increases with stitching and periphery, the number of BnB structures required to provide effective fabrication of a product, monitoring of the lithography process, and alignment feedback to the expose tools increases. As a result, an increasing portion of the area on a semiconductor wafer must be devoted to these structures, reducing the area available for product.

Presently, the manufacture of some semiconductor devices, such as image sensors, involves creating a "grid defining pattern," also known as "First level" or "Zero level" by processing a lithography pattern on the expose tool and etching the pattern into the semiconductor wafer. The Zero level mask is typically comprised solely of grid defining BnB and structures to be used as alignment targets by expose tools at subsequent levels. As a result, there is a very low ratio of area where light passes through the mask and exposure optics compared to the area where the exposure light is blocked by the mask. This ratio is sometimes defined as the Reticle Throughout Rate (RTR). Most expose tools utilize some algorithm to compensate for lens and mask heating as a function of RTR. The algorithm is not always accurate at very low RTR (e.g., <0.1%). As a result, a series of semiconductor wafers processed sequentially through the expose tool using a grid defining level mask may exhibit wafer-to-wafer magnification and focus drifts, which are undesirable features in grid defining levels.

Figure 4:
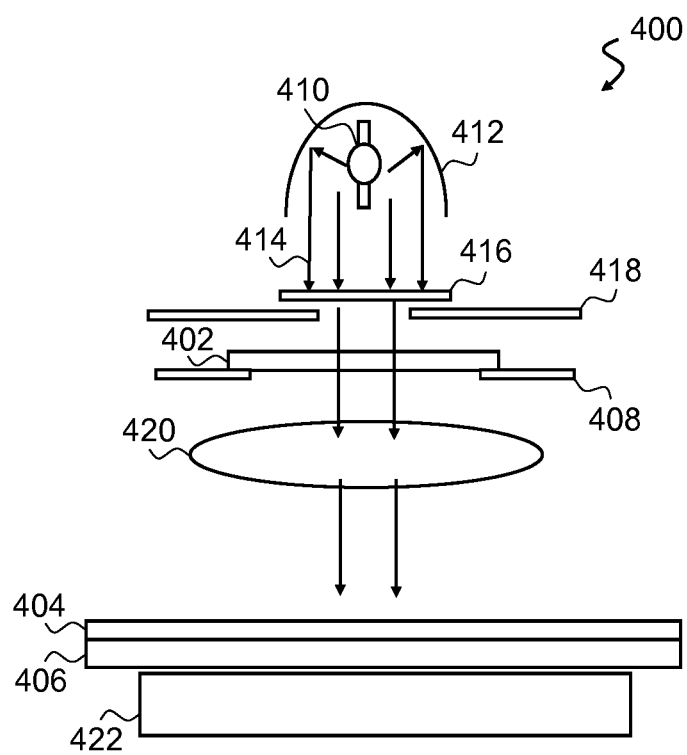
FIG. 4 depicts a simplified cross-sectional view of an exposure tool that can be included a stepper system in an embodiment in accordance with the invention.

Referring now to FIG. 4, there is shown a simplified cross-sectional view of an exposure tool that can be included a stepper system in an embodiment in accordance with the invention. Exposure tool 400 projects the features on mask 402 onto a layer of photosensitive material 404 formed on wafer 406. Mask 402 is held in place on a mask stage 408.

Light energy emitted from light source 410 is collected and directed by reflecting surface 412 to produce collimated, homogenized exposure light 414. Light 414 propagates through shutter 416, masking blades 418, and mask 402. The light 414 that passes through mask 402 is then imaged by optics 420 and projected onto photosensitive material 404. Optics 420 can adjust the magnification and focus of the projected image in an embodiment in accordance with the invention. Optics 420 is configured as a lens in the illustrated embodiment. Wafer 406 rests on stage 422 that is configured to move to allow the image being projected to impinge on different portions of photosensitive material 404.

Figure 5:
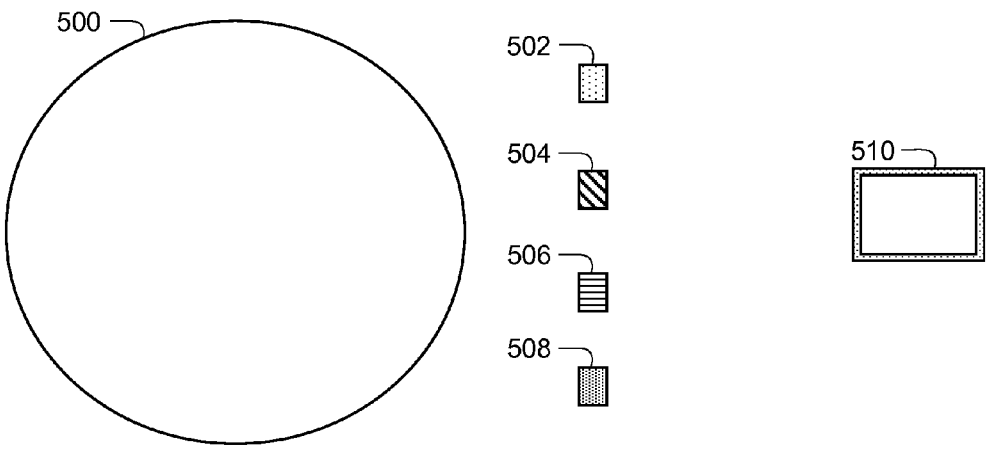
FIG. 5 illustrates a wafer and unit mask patterns that will define the resist pattern in an embodiment in accordance with the invention.

FIG. 5 depicts a wafer and unit mask patterns that will define the resist pattern in an embodiment in accordance with the invention. Wafer 500 is a silicon wafer in an embodiment in accordance with the invention. Unit cells 502, 504, 506, 508 are to be stitched on wafer 500. Periphery pattern 510 is to be formed around each grouping of stitched unit cells.

Figure 6:
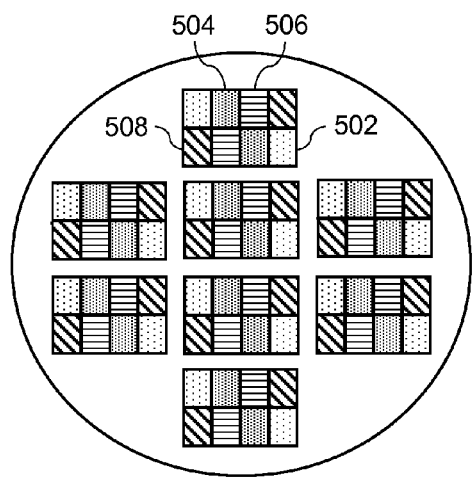
FIG. 6 depicts eight groups of eight stitched unit cells in an embodiment in accordance with the invention.

FIG. 6 illustrates a wafer with eight groups of eight stitched unit cells in an embodiment in accordance with the invention. For each unit cell, a stepper exposed a mask onto a photosensitive material (not shown) formed on wafer 500. Unit cells 502, 504, 506, 508 are stitched together to produce circuitry for eight yet-to-be-completed semiconductor devices. Although only eight devices are shown, those skilled in the art recognize any number of semiconductor devices can be formed in a semiconductor wafer. Additionally, the number of unit cells in each group of stitched unit cells can differ in other embodiments in accordance with the invention. The unit cells can be the same or different pattern, as required by the device being manufactured.

Figure 7:
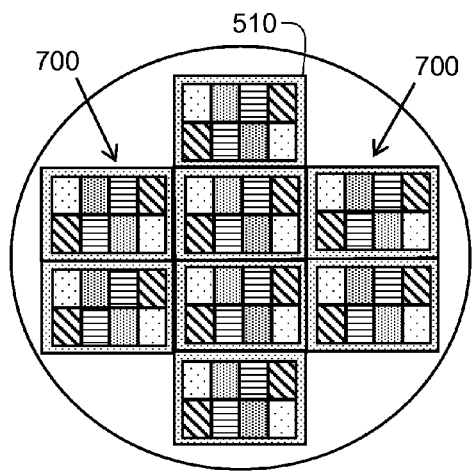
FIG. 7 illustrates eight completed semiconductor devices 700 formed on wafer 500 in an embodiment in accordance with the invention.

FIG. 7 depicts eight completed semiconductor devices 700 formed in wafer 500 in an embodiment in accordance with the invention. Periphery pattern 510 is formed around each group of stitched unit cells (group 502, 504, 506, 508). For each group of unit cells, a stepper exposed a mask of periphery pattern onto a photosensitive material (not shown) formed on wafer 500. The periphery pattern 510 and each group of unit cells 502, 504, 506, 508 are stitched together to produce circuitry for eight completed semiconductor devices.

Figure 8:
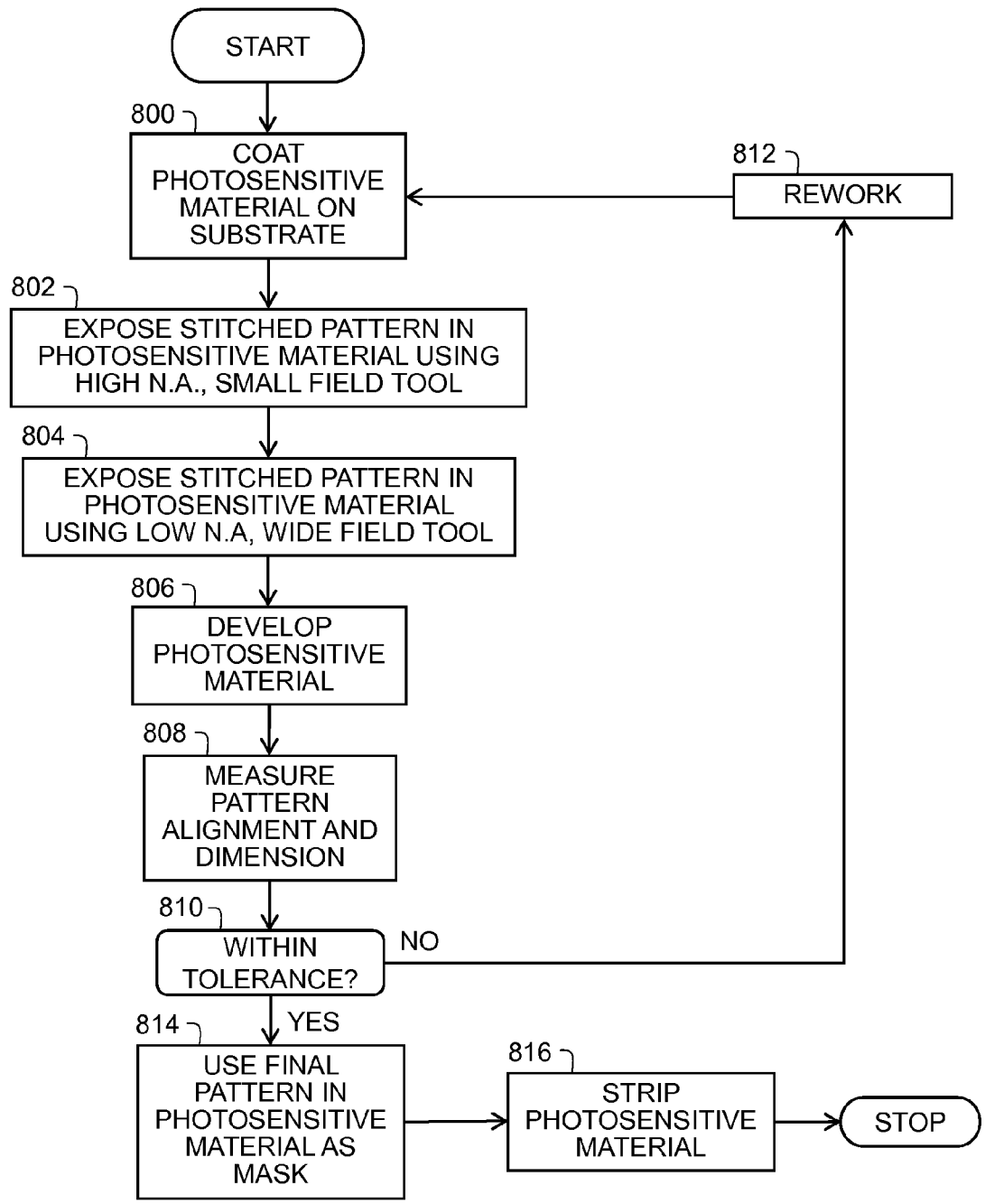
FIG. 8 is a flowchart of a first method for stitching in an embodiment in accordance with the invention.

Referring now to FIG. 8, there is shown a flowchart of a first method for stitching in an embodiment in accordance with the invention. The illustrated embodiment is used to describe a single layer process where a layer of photosensitive material is exposed on a separate expose tools having different exposure field sizes. Initially, as shown in block 800, a layer of photosensitive material is formed over a semiconductor wafer. An abutting field pattern is then exposed in the photosensitive material using a high numerical aperture (N.A.) small field tool (block 802). A high NA small field tool can have, for example, an NA that is between 0.35 and 1.0.

Another pattern, an abutting field pattern, is then exposed in the photosensitive material using a low N.A. (such as less than 0.35) wide field tool (block 804). In the present embodiment, this would be the periphery of the device, and may be aligned to the latent image of the abutting field pattern exposed in block 802. The photosensitive material is then developed, as depicted in block 806. If a positive photosensitive material is used, the chemical structure of the photosensitive material exposed to the light changes so that the photosensitive material is more soluble in a solution known as a "developer" solution. The exposed photosensitive material is washed away by the developer solution while the photosensitive material not exposed remains on the wafer. With a positive photosensitive material, the mask (e.g., mask 402 in FIG. 4) contains an exact copy of the pattern that is to remain on the wafer.

If a negative photosensitive material is used, the chemical structure of the photosensitive material exposed to the light changes so that the photosensitive material is more insoluble the developer solution. The photosensitive material not exposed to the light is washed away by the developer solution while the photosensitive material exposed to the light remains on the wafer. With a negative photosensitive material, the mask (e.g., mask 402 in FIG. 4) contains an inverse (or photographic "negative") of the pattern to be transferred.

Returning to FIG. 8, the alignment and dimensions of the stitched patterns are measured and analyzed at block 808. The measurement data can also be recorded in a memory in an embodiment in accordance with the invention. A determination is then made as to whether or not the alignment is within a given tolerance (block 810). If one or more alignments are not within a given tolerance, the wafer is subjected to a rework process (block 812). By way of example only, the rework process can include optimizing the expose tool parameters, removing the photosensitive material from the wafer, cleaning the wafer, and returning to block 800 to repeat the method.

If the alignment is within a given tolerance at block 810, the method passes to block 814 where the final pattern formed in the photosensitive material remaining on the wafer is used in a subsequent processing step. For example, the wafer can be implanted with dopants to form implant regions in the wafer. Alternatively, the wafer can be etched or a material, such as a conductive material, can be deposited on the wafer. Once the subsequent processing step is completed, the photosensitive material can be removed from the wafer, as shown in block 816. Those skilled in the art will recognize that block 816 is optional and in some embodiments in accordance with the invention the photosensitive material will not be removed from the wafer.

Figure 9:
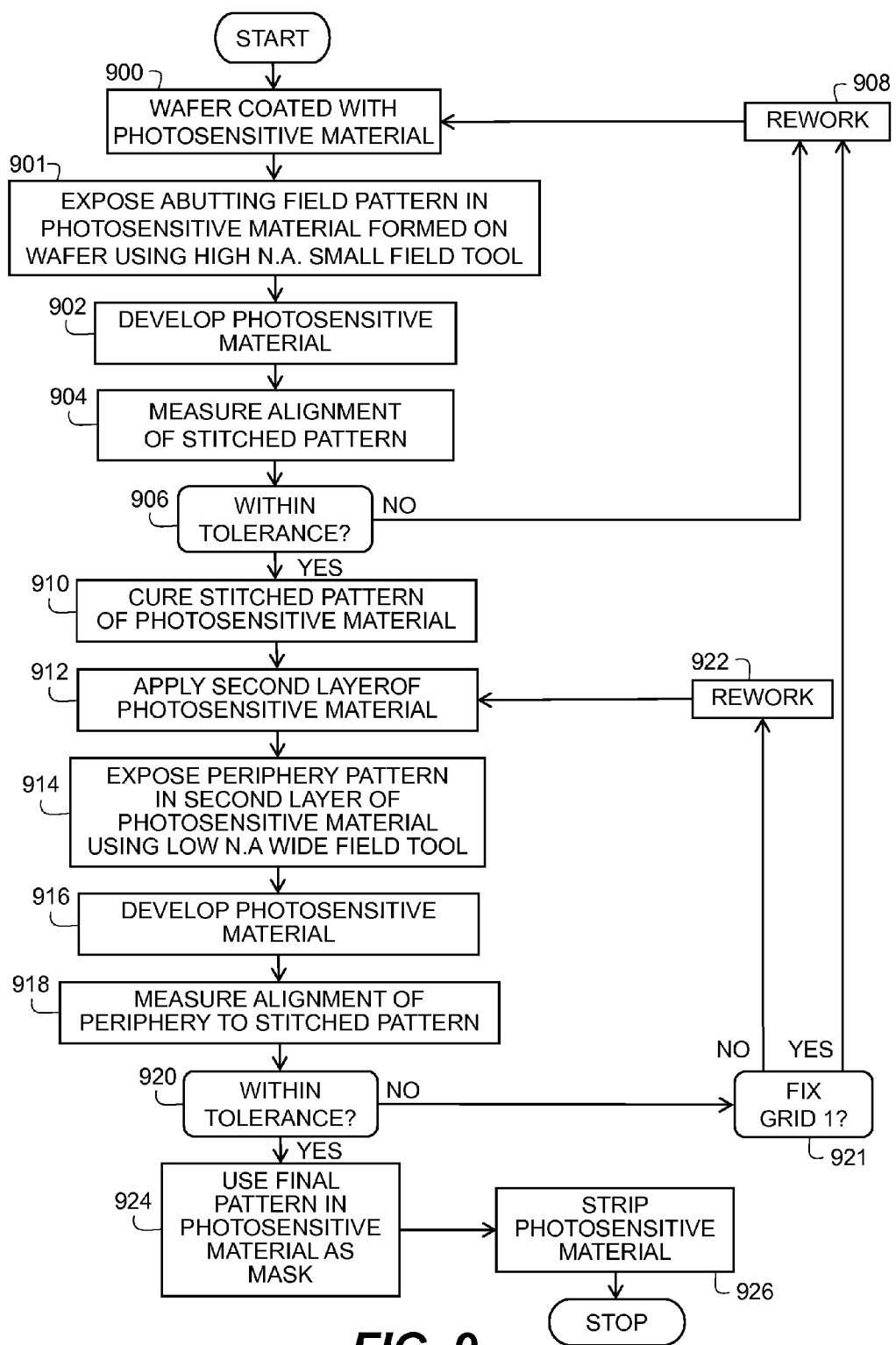
FIG. 9 is a flowchart of a second method for stitching in an embodiment in accordance with the invention.

FIG. 9 is a flowchart of a second method for stitching in an embodiment in accordance with the invention. The illustrated embodiment is used to describe a dual layer process where layers of photosensitive material are exposed on a separate expose tool having different exposure field sizes followed by a periphery expose on a wide-field expose tool. Initially, a wafer is coated with photosensitive material 900. Then as shown in block 901, an abutting field pattern is exposed in a photosensitive material using a high N.A. small field tool. The photosensitive material is then developed, as depicted in block 902. As described earlier, the photosensitive material exposed to the light is washed away by the developer solution when a positive photosensitive material is used. For a negative photosensitive material, the photosensitive material not exposed to the light is washed away by the developer solution.

The alignment of the stitched pattern is then measured and analyzed at block 904. The measurement data can also be stored in a memory. The measurement data can be used to compute corrections for the expose tool to optimize the intra-expose field alignment for the exposure of the next wafer, or set of wafers, on the high N.A. small field tool.

A determination is then made as to whether or not the alignment is within a given tolerance (block 906). If the alignment is not within the given tolerance, the wafer is subjected to a rework process (block 908). By way of example only, the rework process can include optimizing the expose tool parameters, removing the photosensitive material from of wafer, cleaning the semiconductor wafer, applying another first layer of photosensitive material over the wafer, and returning to block 900 to repeat the method.

Returning to block 906, if the alignment is within a given tolerance, the process passes to block 910 where the remaining photosensitive material is cured to solidify the photosensitive material and fix the pattern in the photosensitive material. Another layer of photosensitive material is coated over the wafer and a periphery pattern exposed in the photosensitive material using a low N.A. wide field tool, as shown in blocks 912 and 914. The photosensitive material is then developed at block 916.

The alignment of the periphery pattern to the stitched pattern is measured and analyzed at block 918. The measurement data can also be stored in a memory. The measurement data can be used to compute corrections for both the high N.A. small field tool and the low N.A. wide field tool, to optimize the intra-expose field alignment for the exposure of the second layer of photosensitive material, or to make any corrections that are required to the first layer pattern to optimize alignment of the two patterns on the next wafer or set of wafers.

A determination is then made at block 920 as to whether or not the alignment is within a given tolerance. If the alignment is not within the given tolerance, a determination is made as to whether or not the first grid level (grid 1) needs to be fixed (block 921). If so, the method passes to block 908.

If the first grid level does not need to be fixed, the process passes to block 922 for a rework process. The rework process can include removing the uncured second layer of photosensitive material from the wafer, cleaning the semiconductor wafer, and returning to block 912 to repeat blocks 912 through 920 in one embodiment in accordance with the invention.

Returning to block 920, if the alignment is within the given tolerance the method passes to block 924 where the final pattern formed by the photosensitive material remaining on the wafer is used in a subsequent processing step. As discussed earlier, the wafer can be implanted with dopants, the wafer can be etched or a material, such as a conductive material, can be deposited on the wafer. Once the subsequent processing step is completed, the photosensitive material can be removed from the wafer, as shown in block 926. Those skilled in the art will recognize that block 926 is optional and in some embodiments in accordance with the invention the photosensitive material will not be removed from the wafer.

Figure 10:
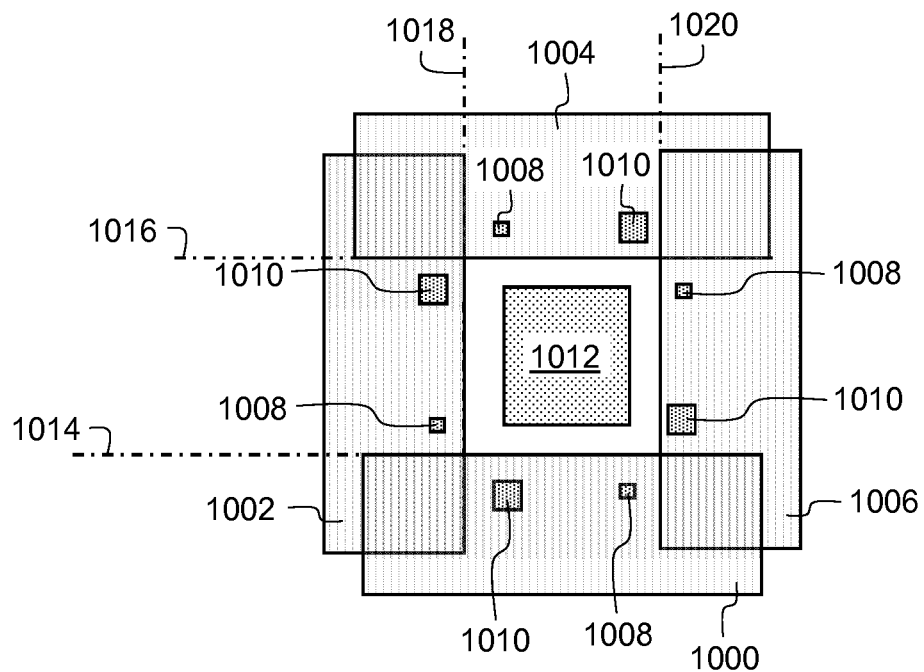
FIG. 10 is a representation of a stepper masking blades and mask layout of a stitched unit cell in an embodiment in accordance with the invention.

Referring now to FIG. 10, there is shown a representation of a mask layout of a stitched unit cell in an embodiment in accordance with the invention. FIG. 10 illustrates the arrangement of the BnB parts relative to the rest of the pattern, and to the masking blades used during stitching of the unit cell. Masking blades 1000, 1002, 1004, 1006 are positioned to block light from striking the measurement structures 1008, 1010 when a stitched unit cell 1012 is exposed.

Line 1014 represents the position of masking blade 1000 to prevent exposing the complementary parts of the BnB structure below unit cell 1012. Line 1016 represents the position of masking blade 1004 to prevent exposing the complementary parts of the BnB structure above unit cell 1012. Line 1018 represents the position of masking blade 1002 to prevent exposing the complementary parts of the BnB structure to the left of unit cell 1012. And line 1020 represents the position of masking blade 1006 to prevent exposing the complementary parts of the BnB structure to the right of unit cell 1012.

Figure 11:
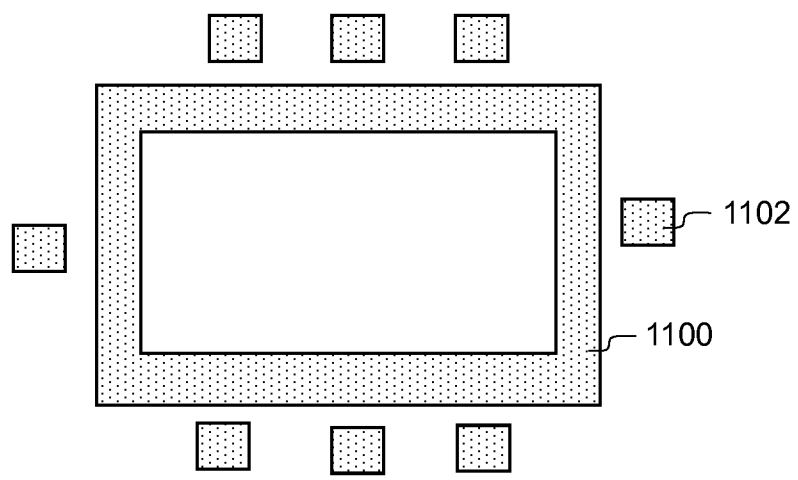
FIG. 11 depicts a mask layout of a periphery in an embodiment in accordance with the invention.

FIG. 11 depicts a mask layout of a periphery in an embodiment in accordance with the invention. The illustrated embodiment shows the relative position of periphery pattern 1100 and parts of measurement structures 1102. The measurement structures shown in FIGS. 10 and 11 can be complementary parts of a BnB structure. For example, in a three part BnB structure, measurement structure 1008 in FIG. 10 can be in one complementary part, measurement structure 1010 in FIG. 10 in a second complementary part, and measurement structure 1102 in a third complementary part.

Figure 12:
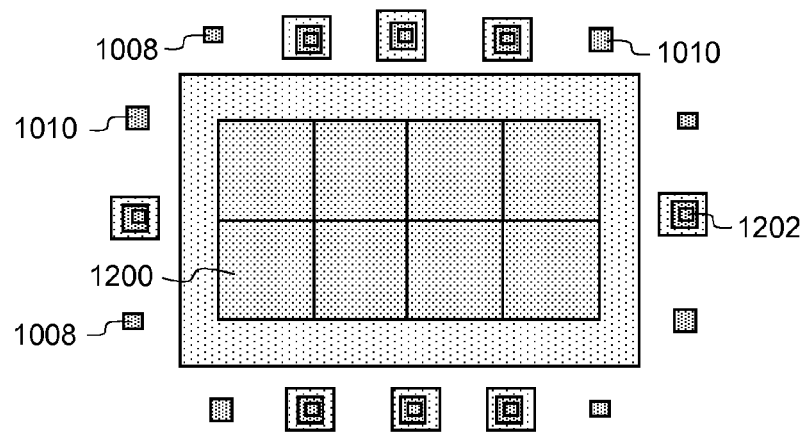
FIG. 12 illustrates an exposed and developed patternable material in an embodiment in accordance with the invention.

Referring now to FIG. 12, there is shown an exposed and developed photosensitive layer in an embodiment in accordance with the invention. Stitched unit cells 1200 and complete BnB measurement structures 1202 are depicted in the illustrated embodiment. The complete BnB measurement structures 1202 are produced by superimposing the parts of the measurement structures 1008, 1010 in FIG. 10 with the complementary parts 1102 in FIG. 11. Measurement of the complete BnB structures 1202 is used to determine the relative positions of the stitched unit cells 1200 to each other.

The stitching format can also leave single parts 1008 and 1010 of the measurement structure at each corner of the pattern that can be used as part of standard BnB to measure alignment back to a prior level on the semiconductor wafer.

Presently, the manufacture of some semiconductor devices, such as image sensors, involves creating a "grid defining pattern," also known as "First level" or "Zero level" by processing a lithography pattern on the expose tool and etching the pattern into the semiconductor wafer. The Zero level mask is typically comprised solely of grid defining BnB and structures to be used as alignment targets by expose tools at subsequent levels. As a result, there is a very low ratio of area where light passes through the mask and exposure optics compared to the area where the exposure light is blocked by the mask. This ratio is sometimes defined as the Reticle Throughout Rate (RTR). Most expose tools utilize some algorithm to compensate for lens and mask heating as a function of RTR. The algorithm is not always accurate at very low RTR (e.g., <0.1%). As a result, a series of semiconductor wafers processed sequentially through the expose tool using a grid defining level mask may exhibit wafer-to-wafer magnification and focus drifts, which are undesirable features in grid defining levels.

Figure 13:
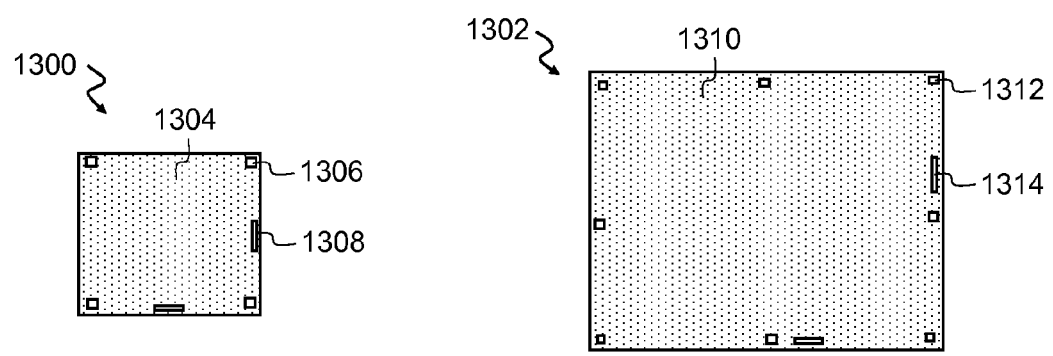
FIG. 13 depicts prior art grid defining mask patterns.

FIG. 13 illustrates prior art grid defining mask patterns represented by patterns 1300, 1302. Pattern 1300 represents a mask used to expose a small unit cell that is opaque 1304 except for BnB structures 1306 and alignment targets 1308. Alignment targets 1308 can be used in subsequent processing steps. Pattern 1302 depicts a mask for a larger field periphery that is opaque 1310 except for BnB structures 1312 and alignment targets 1314.

Figure 14:
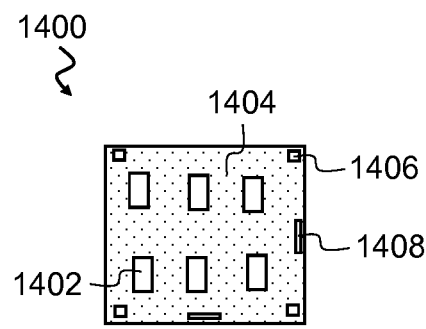
FIG. 14 illustrates an example of a pattern suitable for use in a grid defining level for a small unit cell in an embodiment in accordance with the invention.

Referring now to FIG. 14, there is shown an example of a pattern suitable for use in a grid defining level for a small unit cell in an embodiment in accordance with the invention. Pattern 1400 includes transparent spaces 1402 in the opaque field 1404, BnB structures 1406, and alignment targets 1408.

Figure 15:
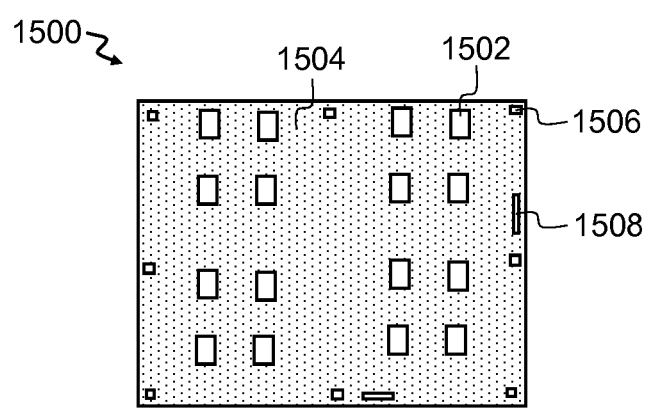
FIG. 15 depicts an example of a pattern suitable for use in a grid defining level for a large field periphery in an embodiment in accordance with the invention.

FIG. 15 illustrates an example of a complementary pattern suitable for use in a grid defining level for a large field periphery in an embodiment in accordance with the invention. Pattern 1500 includes transparent spaces 1502 in the opaque field 1504, BnB structures 1506, and alignment targets 1508.

Figure 16:
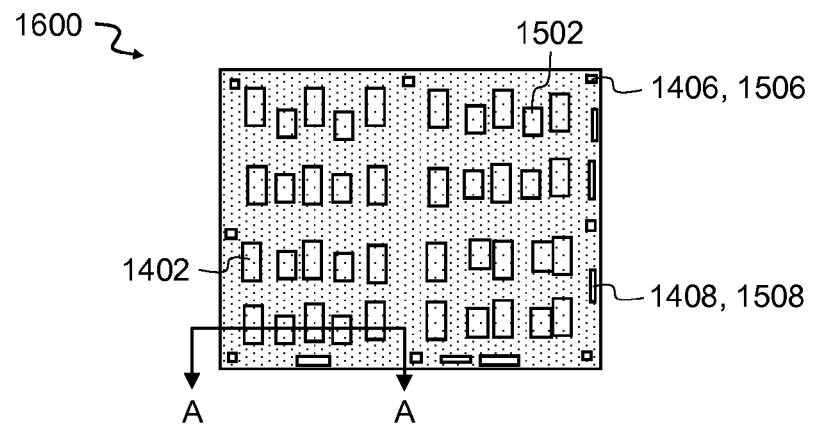
FIG. 16 illustrates a double resist pattern in an embodiment in accordance with the invention.

The two patterns 1400 and 1500 can be used to produce a double resist pattern. Referring now to FIG. 16, there is shown a double resist pattern in an embodiment in accordance with the invention. In the FIG. 16 embodiment, double resist pattern 1600 is used for an active area of a semiconductor device pattern. Double resist pattern 1600 is formed by superimposing the grid defining levels from FIGS. 14 and 15. FIG. 14 is stitched in a 2 by 2 array inside the boundary represented in FIG. 15. Transparent areas 1402, 1502 are arranged so as to be separate and distinct while the BnB structures 1406, 1506 and alignment targets 1408, 1508 are superimposed in the illustrated embodiment. The relative sizes and shapes of 1402 and 1502 in FIG. 15 are for conceptual purposes and are not meant to indicate macro or micro scale, or number of features.

Figure 17:
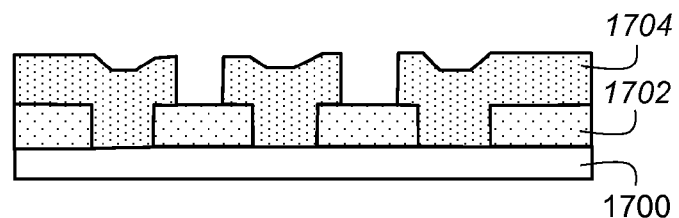
FIG. 17 is a cross-sectional view along line A-A shown in FIG. 16.

FIG. 17 is a cross-sectional view along line A-A shown in FIG. 16. Wafer 1700 is covered by at least one layer of photosensitive material (except for the BnB and alignment structures, not included in section A-A) in an embodiment in accordance with the invention. The photosensitive material can be from the first grid processing 1702, the second grid processing 1704, or both in the active area of the device pattern.

Figure 18:
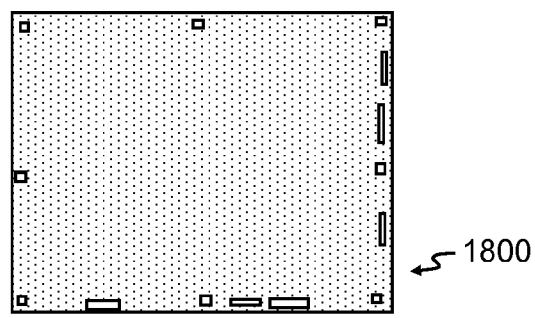
FIG. 18 depicts a pattern after double resist pattern 1600 shown in FIG. 16 is permanently transferred to a semiconductor wafer in an embodiment in accordance with the invention.

Referring now to FIG. 18, there is shown a pattern 1800 after double resist pattern 1600 shown in FIG. 16 is permanently transferred to a wafer in an embodiment in accordance with the invention. One technique to permanently transfer the double resist pattern 1600 is to etch pattern 1600 into a wafer. The final etched pattern is identical to what would have been the result of the use of patterns 1300 and 1302 (FIG. 13) that do not include the additional features 1402 and 1502 that are used in patterns 1400 and 1500 (FIGS. 14 and 15) to increase RTR.

The grid defining level depicted in FIG. 14 can be a first grid level (grid 1) and the grid defining level in FIG. 15 a second grid level (grid 2). A first type of expose tool is used to expose grid 1 in photosensitive material formed over a wafer. The pattern can then developed and measured using the abutting field BnB structures to ensure that Chip magnification is equal to wafer magnifications, and Chip rotation is equal to wafer rotations.

The photosensitive material defining grid 1 is then cured and a second layer of photosensitive material is formed over the wafer. A second type of expose tool is used to expose grid 2, aligning grid 2 to grid 1. The second pattern is developed and measured first using abutting field BNB structures to ensure the grid 2 Chip magnification equals the grid 2 wafer magnifications and grid 2 Chip rotation equals the grid 2 wafer rotations. Next, the alignment of grid 2 to grid 1 is measured. Evaluation of the data allows the computation of exposure tool corrections to optimize the alignment of the grids on subsequent semiconductor wafers, and allows the rework of any wafers where the grids are not aligned to the given tolerance. Once the alignment of grid 1 and grid 2 is acceptable, the combined lithography pattern consisting of grid 1 and grid 2 is etched into the wafer and the lithography pattern is removed. By optimizing the alignment of the individual grids, and of grid to grid, the alignment of subsequent levels of lithography that require stitching of unit cells with grid 1 and a periphery exposed by grid 2 is more easily kept to tighter tolerances than if each grid were allowed to drift independently.

An additional advantage to the dual level process for defining both grids is that it allows for additional sacrificial features 1402, 1502 to be added into the device area for each grid defining mask. This increases the RTR to a value such that it is in the range where the algorithms for the expose tools compensate correctly for magnification and focus associated with optics and mask heating. This is accomplished by adding the additional sacrificial features such that the areas exposed by the grid 1 mask (except for the required BnB and alignment structures) are left unexposed in the second layer of resist by the grid 2 mask, and vice-versa.

The invention has been described in detail with particular reference to certain embodiments thereof, but it will be understood that variations and modifications can be effected within the spirit and scope of the invention. Additionally, even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible. For example, the embodiments described herein have been described with reference to photosensitive materials and photolithography. Other embodiments in accordance with the invention, however, are not limited to these materials and process. Other forms of energy, such as, for example, electron beam or x-ray, can be used instead of light. And patternable materials other than photosensitive materials can be used.

PARTS LIST

100 BnB structure
102 edge
104 edge
106 edge
108 edge
110 edge
112 edge
114 pattern
116 pattern
202 peak
204 peak
206 peak
208 peak
210 peak
212 peak
300 portion of BnB structure
302 shaded region
304 shaded region
306 non-shaded region
308 label
310 complementary part of BnB structure
312 shaded region
314 non-shaded region
316 label
318 complementary part of BnB structure
320 shaded region
322 shaded region
324 outer edge of BnB structure
326 analogous edge
400 exposure tool
402 mask
404 photosensitive material
406 wafer
408 mask stage
410 light source
412 reflecting surface
414 exposure light
416 shutter
418 masking blades
420 optics
422 stage
500 wafer
502 unit cell
504 unit cell
506 unit cell
508 unit cell
510 periphery pattern
700 semiconductor devices
1000 masking blade
1002 masking blade
1004 masking blade
1006 masking blade
1008 measurement structure
1010 measurement structure
1012 unit cell
1014 line representing position of masking blade
1016 line representing position of masking blade
1018 line representing position of masking blade
1020 line representing position of masking blade
1100 periphery pattern
1102 measurement structures
1200 stitched unit cells
1202 complete BnB structure
1300 pattern
1302 pattern
1304 mask to expose small unit cell
1306 BnB structure
1308 alignment target
1310 mask to expose larger field periphery
1312 BnB structure
1314 alignment target
1400 pattern
1402 transparent space
1404 opaque field
1406 BnB structure
1408 alignment target
1500 pattern
1502 transparent space
1504 opaque field
1506 BnB structure
1508 alignment target
1600 double resist pattern
1700 wafer
1702 photosensitive material from first grid processing
1704 photosensitive material from second grid processing
1800 double resist pattern transferred to wafer

What is claimed is:

1. A method for producing a completed measurement structure using (i) a first exposure tool having a first maximum expose field, (ii) a second exposure tool having a second maximum expose field larger than the first maximum expose field, (iii) a first mask defining one or more unit-cell patterns and one or more first-alignment-feature patterns proximate the one or more unit-cell patterns, and (iv) a second mask defining a periphery pattern for at least partially surrounding a plurality of the unit-cell patterns and, proximate the periphery pattern, one or more second-alignment-feature patterns, the method comprising:

utilizing the first exposure tool, exposing a layer of photosensitive material through the first mask in a plurality of different locations such that, after the first exposure, each subsequent exposure exposes, a) in the layer of photosensitive material, one of the unit-cell patterns abutting at least one of the previous unit-cell patterns thereby forming an abutting field pattern in the layer of photosensitive material and exposes, b) in the layer of photosensitive material, one of the first-alignment-feature patterns overlapping at least one of the previous first-alignment-feature patterns, thereby forming a partially complete measurement structure in the layer of photosensitive material;

utilizing the second exposure tool, exposing the layer of photosensitive material through the second mask to form the periphery pattern in the layer of photosensitive material at least partially surrounding the abutting field pattern, the exposure through the second mask exposing one of the second-alignment-feature patterns to overlap the at least two overlapping first-alignment-feature patterns; and developing the layer of photosensitive material to remove a portion thereof, wherein unremoved portions of the layer of photosensitive material where the second-alignment-feature pattern overlapped the at least two overlapping first-alignment-feature patterns defines the completed measurement structure.

2. The method as in claim 1, wherein (i) the photosensitive material comprises positive photoresist, and (ii) developing the photosensitive material removes the portion thereof exposed to light through at least one of the first mask or the second mask.

3. The method as in claim 1, wherein (i) the photosensitive material comprises negative photoresist, and (ii) developing the photosensitive material removes the portion thereof not exposed to light through the first mask or the second mask.

4. The method as in claim 1, wherein a numerical aperture of the first exposure tool is between 0.35 and 1.0.

5. The method as in claim 1, wherein a numerical aperture of the second exposure tool is less than 0.35.

6. A method for producing a completed measurement structure in a first layer of photosensitive material and a second layer of photosensitive material disposed over a substrate using (i) a first exposure tool having a first maximum expose field, (ii) a second exposure tool having a second maximum expose field larger than the first maximum expose field, (iii) a first mask defining one or more unit-cell patterns and one or more first-alignment-feature patterns proximate the one or more unit-cell patterns, and (iv) a second mask defining a periphery pattern for at least partially surrounding a plurality of the unit-cell patterns and, proximate the periphery pattern, one or more second-alignment-feature patterns, the method comprising:

forming the first layer of photosensitive material over the substrate;
   utilizing the first exposure tool, exposing the first layer of photosensitive material through the first mask in a plurality of different locations such that, after the first exposure, each subsequent exposure exposes, a) in the first layer of photosensitive material, one of the unit-cell patterns abutting at least one of the previous unit-cell patterns thereby forming an abutting field pattern in the first layer of photosensitive material, and exposes, b) in the first layer of photosensitive material, one of the first-alignment-feature patterns overlapping at least one of the previous first-alignment-feature patterns, thereby forming a partially complete measurement structure in the first layer of photosensitive material;
   developing the first layer of photosensitive material to remove portions thereof;
   forming the second layer of photosensitive material over the developed first layer of photosensitive material;
   utilizing the second exposure tool, exposing the second layer of photosensitive material through the second mask to form the periphery pattern in the second layer of photosensitive material at least partially surrounding the abutting field pattern defined in the first layer of photosensitive material, the exposure through the second mask exposing one of the second-alignment-feature patterns to overlap the at least two overlapping first-alignment-feature patterns defined in the first layer of photosensitive material; and
   developing the second layer of photosensitive material to remove portions thereof, wherein unremoved portions of the second layer of photosensitive material where the second-alignment-feature pattern overlapped the at least two overlapping first-alignment-feature patterns defined in unremoved portions of the first layer of photosensitive material together defines the completed measurement structure.

7. The method as in claim 6, further comprising determining offsets for the first and second exposure tools based on alignment of the first-alignment-feature patterns and the second-alignment-feature patterns within the measurement structure.

8. The method as in claim 6, wherein (i) the first and second layers of photosensitive material comprise positive photoresist, and (ii) developing the first and second layers of photosensitive material removes the portions thereof exposed to light through at least one of the first mask or the second mask.

9. The method as in claim 6, wherein (i) the first and second layers of photosensitive material comprise negative photoresist, and (ii) developing the first and second layers of photosensitive material removes the portions thereof not exposed to light through the first mask or the second mask.

10. The method as in claim 6, wherein a numerical aperture of the first exposure tool is between 0.35 and 1.0.

11. The method as in claim 6, wherein a numerical aperture of the second exposure tool is less than 0.35.

* * * * *